United States Patent [19]
Cain et al.

[11] Patent Number: 5,133,017
[45] Date of Patent: Jul. 21, 1992

[54] NOISE SUPPRESSION SYSTEM

[75] Inventors: John J. Cain, Phoenix; Jamie Chait, Chandler; David Dye, Phoenix; Dennis Barnes, Mesa, all of Ariz.

[73] Assignee: Active Noise and Vibration Technologies, Inc., Phoenix, Ariz.

[21] Appl. No.: 507,365

[22] Filed: Apr. 9, 1990

[51] Int. Cl.[5] .......................................... H03B 29/00
[52] U.S. Cl. ................................................. 381/71
[58] Field of Search ........................ 381/71, 72, 94; 181/206

[56] References Cited

U.S. PATENT DOCUMENTS

| | | | |
|---|---|---|---|
| 3,712,412 | 1/1973 | Hassett et al. | 181/206 |
| 3,936,606 | 2/1976 | Wanke | 381/71 |
| 4,044,203 | 8/1977 | Swinbanks | 381/71 |
| 4,177,874 | 12/1979 | Angelini et al. | 181/206 |
| 4,527,282 | 7/1985 | Chaplin et al. | 381/71 |
| 4,665,549 | 5/1987 | Eriksson et al. | 381/71 |
| 4,715,559 | 12/1987 | Fuller | 381/71 |
| 4,977,600 | 12/1990 | Ziegler | 381/71 |

FOREIGN PATENT DOCUMENTS 8907701 8/1989 European Pat. Off. ............ 181/206

Primary Examiner—Forester W. Isen
Attorney, Agent, or Firm—Handal & Morofsky

[57] ABSTRACT

A noise cancellation system, comprising a symmetrical assembly of microphone inputs is disclosed. A controller receives the output of the microphone assembly and generates an electrical cancellation signal having a polarity opposite the polarity of a portion of a noise to be cancelled and a magnitude equal to the magnitude of the portion of the noise to be cancelled. An actuator receives the electrical cancellation signal and outputs an audio cancellation signal.

39 Claims, 4 Drawing Sheets

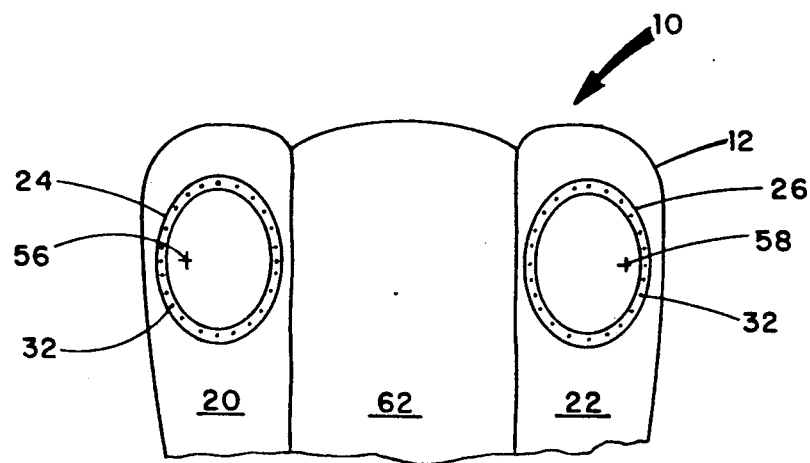
Fig. 1
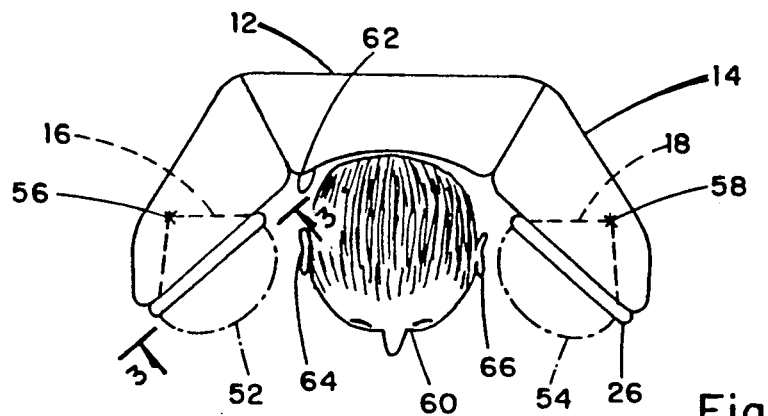
Fig. 2
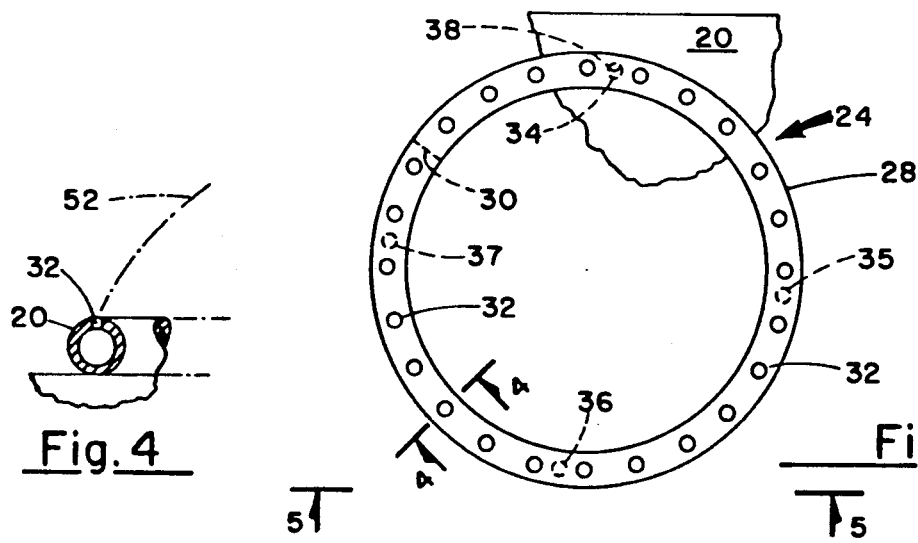
Fig. 4
Fig. 3

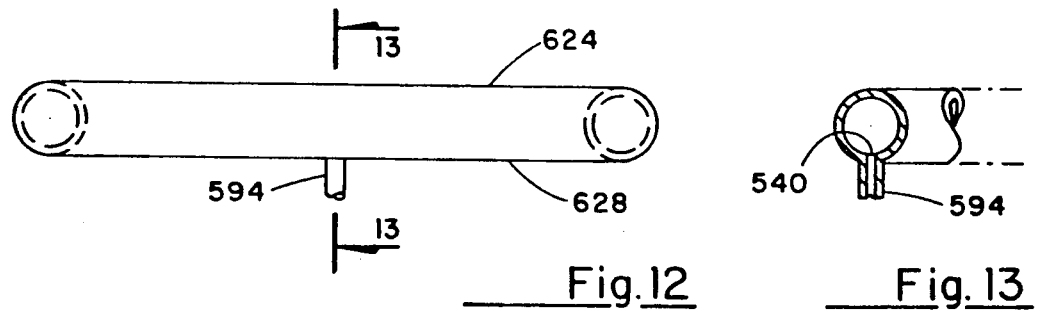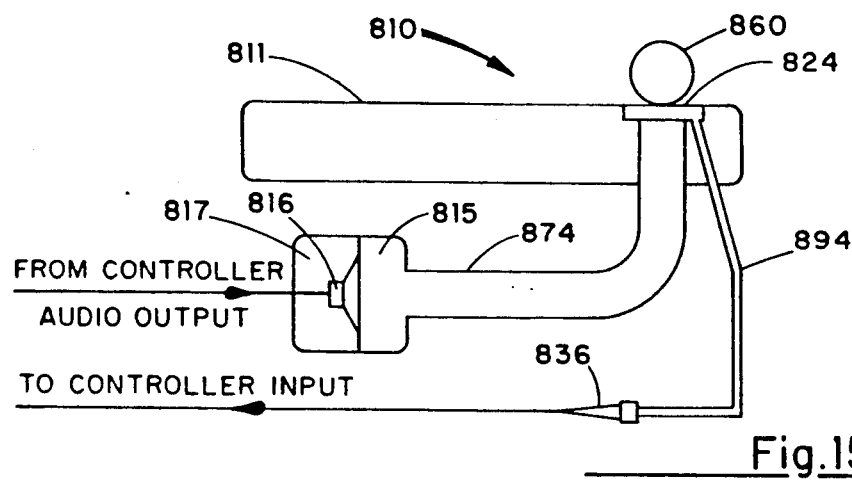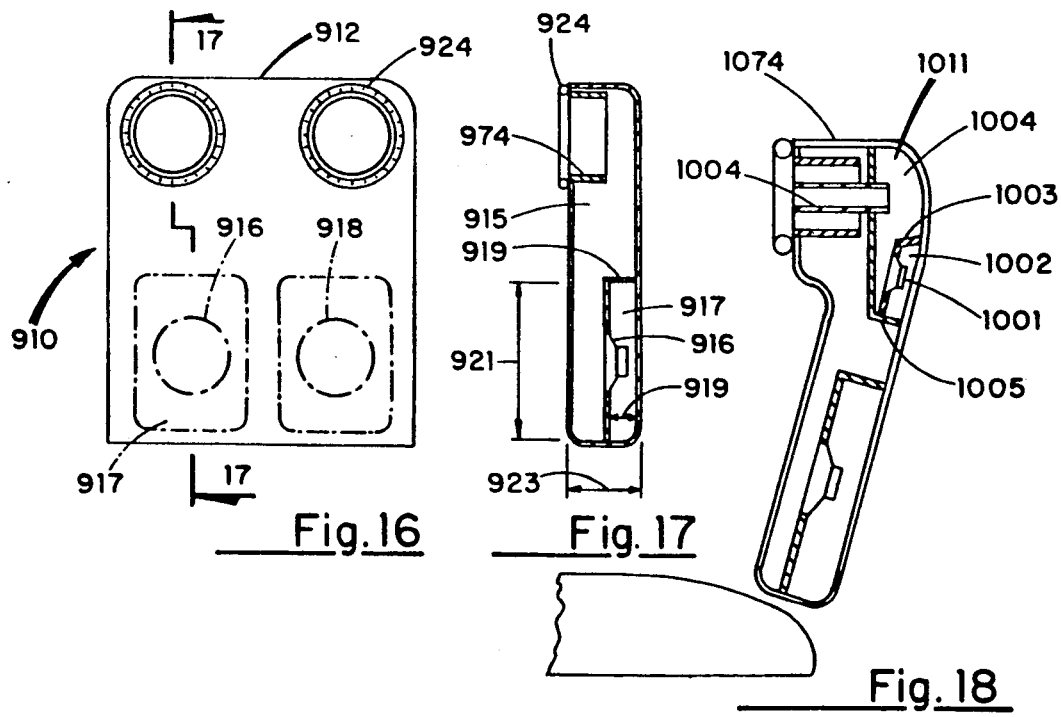

NOISE SUPPRESSION SYSTEM

TECHNICAL FIELD

The present invention relates to the field of dynamic noise cancellation systems of the type in which an audio signal is produced for the purpose of cancelling noise at a given location.

BACKGROUND

In a wide variety of situations, environmental noise presents substantial problems ranging from stress, safety hazards and annoyance to physiological damage. Until recently, efforts at noise control have centered primarily about either reducing the amount of noise created or using sound absorbing materials to absorb and deaden environmental noise.

For example, in the case of an automobile, engine noise is first suppressed through the use of a muffler. It then remains to prevent residual engine noise, road noise, wind noise and the like from entering the passenger compartment of the vehicle. Typically, this is done by lining the cabin area of the vehicle with sound absorbing and sound shielding material. Such materials are applied to the floor, the ceiling and sidewalls of the cabin area.

These materials generally perform two functions, namely, the function of shielding the passenger cabin from noise outside the vehicle and absorbing any noises which enter the passenger cabin.

While this sort of approach does achieve a large degree of success in protecting the passenger from environmental noise, still a substantial amount of noise remains.

In other areas of technology, conventional noise reduction techniques are of little or no value. For example, in the case of a dentist's chair, the above techniques provide little or no relief from the stress inducing noises produced by the dentist's drill. While to some extent a portion of the noise created by the dentist's drill is transmitted through the tissues in the head of the patient to the ear, this represents a relatively minor part of the problem. Nevertheless, because of the difficulties involved in approaching the remaining air propagated repetitive noise, virtually nothing has been done in addressing the problem of the remaining noise.

Turning to another area in the health care field, the extremely high levels of noise experienced by the patient during the operation of a nuclear magnetic resonance imaging device is of an extremely high level. This, coupled with the possibly very serious nature of the illnesses involved, combine to create an extremely high level of physical and psychological discomfort. In addition, because of the nature of this equipment, including both its physical configuration and electronic characteristics, conventional noise reducing approaches cannot be employed.

In the past, dynamic noise cancellation systems have been devised. Such systems generally involve the generation of a second audio signal which is equal in magnitude to the noise to be eliminated but opposite in sign at the point where one desires to achieve noise cancellation.

Typically, a microphone is positioned at the point where cancellation is desired. The microphone generates a signal which is indicative of the amplitude of noise at that point, and this signal is sent to a processor which generates the cancellation signal and sends it to an actuator which is often a conventional loudspeaker, which in turn produces a cancellation audio signal at the point where quiet is desired.

While this sort of approach certainly does go a long way in reducing environmental noise problems, such systems have some limitations when it comes to achieving noise cancellation over a desired range of areas.

A possibly major problem in dynamic noise cancellation systems is the positioning of a microphone near the point where one wishes to achieve effective dynamic noise cancellation. This results in a number of obvious problems, namely, the introduction of microphones close to, for example, the ears of an individual in a car or other vehicle. This introduces potential safety hazards, as well as inconvenience and potential discomfort.

In addition, such approaches present aesthetic problems which, for example, in the context of a passenger automobile, are an important negative consideration to potential buyers. More importantly, protruding microphones and the like, besides presenting a hazard to the safe operation of the vehicle, as noted above, also, in the event of an accident may do damage to the eyes of an individual in the automobile.

SUMMARY OF THE INVENTION

The present invention, as claimed, is intended to provide a remedy. It solves the problem of how to control the shape of the zone in which relative quiet is to be achieved. The same is achieved by providing noise sensing devices at a plurality of points. The points are positioned into a configuration which, together with the characteristics of the cancellation actuator, define a region of relatively effective noise cancellation.

Relatively effective elimination of Gaussian noise components from the cancellation signal is achieved through the use of numerous microphone inputs. In accordance with the preferred embodiment, such numerous inputs are provided by a tubular shaped member having a plurality of holes defined therein and oriented at positions to achieve maximum signal-to-noise ratio for the cancellation surface being generated. At the same time, the use of a tubular member results in acoustic averaging of Gaussian noise and thus minimization of the Gaussian noise component.

In accordance with the preferred embodiment, the points are arranged in a closed loop and are provided at the end of a focusing port which generally directs the output of the actuator forward. At the same time, the above configuration also has the advantageous effect of moving the cancellation surface away from the microphone and the actuator, thus minimizing reactive components of the noise cancellation problem and maximizing the effectiveness of cancellation.

Applications of the invention include household furniture, dental chairs, automobile seats, and the like where low levels of environmental noise are desired.

In the particular case of a nuclear magnetic resonance imaging device, the inventive system provides particular value insofar as fabrication may be made with plastic materials which are substantially transparent because of the electronic characteristics of nuclear magnetic resonance imaging systems.

BRIEF DESCRIPTION OF THE DRAWINGS

One way of carrying out the invention is described in detail below with reference to drawings which illustrate only one specific embodiment of the invention and in which:

FIG. 1 is a view of a seat incorporating the inventive noise cancellating system;

FIG. 2 is a top view of the seat of FIG. 1 showing it in use by an individual;

FIG. 3 is an enlarged detail view of one of the components of the noise cancelling system illustrated in FIG. 1;

FIG. 4 is a detail along lines 4—4 of FIG. 3;

FIG. 12 is a detail of an alternative microphone;

FIG. 13 is a view along lines 13—13 of FIG. 12;

FIG. 15 is a noise cancelling medical system;

FIG. 16-17 show a ported seat design; and

FIG. 18 shows a wide range ported design.

BEST MODE FOR CARRYING OUT THE INVENTION

Figure 5:
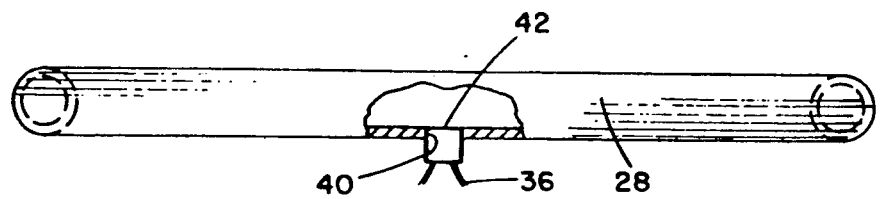
FIG. 5 is a side view partially in cross section along lines 5—5 of FIG. 3.

A seat 10 incorporating a noise cancelling headrest 12 is illustrated in FIG. 1. Generally, headrest 12 is incorporated into the back of a conventional seat, such as an automobile seat or the illustrated wing back chair 14 as illustrated most clearly in FIG. 2.

As illustrated in FIGS. 1 and 2, noise cancelling headrest 12 comprises a pair of actuators 16 which may be conventional loudspeakers. These loudspeakers typically have a diameter in the range of ten to twenty centimeters. Actuators 16 and 18 are positioned behind the front surfaces 20 and 22 of headrest 12. Disposed on front surfaces 20 and 22 are microphone assemblies 24 and 26, respectively.

Microphone assemblies 24 and 26 are substantially identical. Microphone assembly 24 is illustrated in detail in FIGS. 3-5.

Microphone assembly 24 generally comprises a hollow tubular member made of flexible plastic tubing 28. Such tubing is generally available in straight lengths and is capable of being bent into a curved loop, such as the circle illustrated in FIG. 3 without kinking or breaking. Such plastic tubing typically has a thickness on the order of 0.2 centimeters and an inner diameter of approximately 2.5 centimeters. Acceptable materials include polyvinyl chloride tubing, which may be easily attached to itself at seam 30 to provide a continuous closed loop. Tubing 28 also has a plurality of holes 32, about twenty-four being shown in FIG. 3. Holes 32 are typically positioned on the surface of tubing 28 which is opposite the surface of tubing 28 at which tubing 28 is supported on front surface 20 as illustrated in FIG. 4.

While, in principle, a single microphone is sufficient for microphone assembly 24, in accordance with the preferred embodiment of the invention a plurality of microphones, such as microphones 34-37, are employed.

As can be seen in FIG. 5, microphones 34-37 are mounted in holes, such as hole 40, made within tubing 28. Typically, the front surface of a microphone such as surface 42 of microphone 36 is mounted to be flush with the inner surface of tubing 28 as illustrated in FIG. 5.

Figure 6:
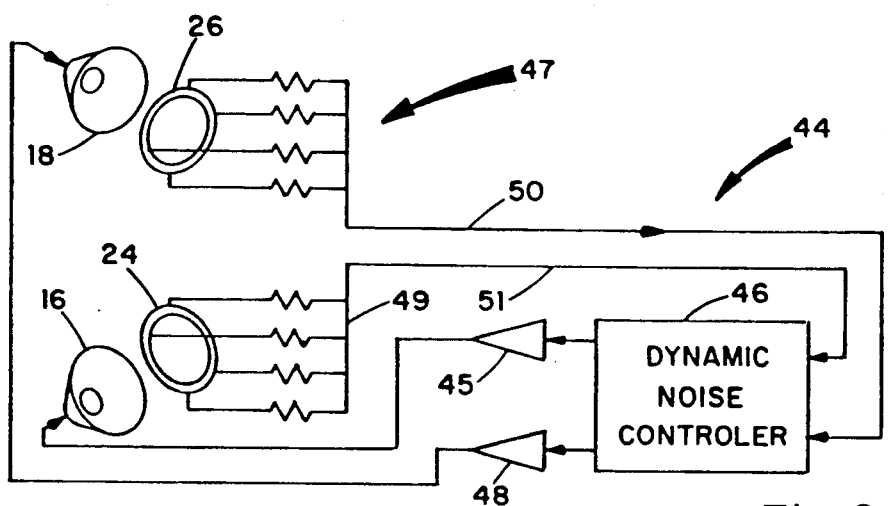
FIG. 6 is a block diagram of the inventive noise cancelling system.

During use, the system illustrated in FIGS. 1-5 is associated with appropriate controller electronics, as illustrated in FIG. 6. Generally, the control system 44 comprises an electronic dynamic noise controller 46, which has its outputs coupled to amplifiers 45 and 48, which in turn have their outputs coupled to actuators 16 and 18. The input of dynamic noise controller 46 is coupled to the mixed output of microphone assemblies 24 and 26. Dynamic noise controller 46 ma be of conventional design. During operation of the system, any environmental noise is sensed by microphone assemblies 24 and 26 and generates error signals which are coupled via resistive or other mixers 47 and 49 and lines 50 and 51 to the inputs of controller 46 which, in turn, generates noise control signals which drive actuators 16 and 18 to generate audio signals equal in amplitude but opposite in sign to the environmental noise which one wishes to cancel. This results in the generation of a cancellation surface at the holes 32 which comprise the audio inputs to the microphone assemblies. Alternatively, mixers 47 and 49 may be replaced by a single operational amplifier with eight inputs.

In addition, the cancellation surface defined by the system extends away from holes 32 along a pair of generally convex cancellation surfaces 52 and 54, as defined by phantom lines in FIG. 2.

Cancellation surfaces 52-54 are generally spherical in form and indicate the locus of an area of maximum cancellation, typically on the order of about fifteen decibels. As one measures cancellation at points removed in either direction from surfaces 52 and 54, noise levels gradually rise.

In the case of an actuator which has a theoretical point source location at points 56 and 58, the cancellation surfaces 52 and 54 substantially take the form of spherical surfaces whose center of rotation is located at points 56 and 58 respectively. In this particular case, the cancellation surfaces 52 and 56 are thus generally spherical segments with a circular base which substantially coincides with the center lines of holes 32 in the respective microphone assembly.

As noted above, the effective surface of maximum cancellation is a part of a sphere and the ring shape of the microphone assembly provides a signal to the controller which is the integrated average noise pressure in the vicinity of the microphone assembly along a line perpendicular to the circle defined by the microphone assembly.

The advantage here is that a minimized substantially spherical zone of silence is provided at the ear position of an individual without the need for providing a protruding microphone at the actual ear position, as in previous designs. As noted above, the use of a protruding microphone is not the most acceptable approach to most users in that it produces a very small sphere of silence which must be located at the ear position to provide useful cancellation. In addition, head movement, the introduction of the hair of the user into the path along which the microphone is detecting sound, and the like may all act to adversely affect the performance of prior art systems. These undesirable characteristics, in addition to the uncomfortable nature of such systems and potential safety hazards in certain applications makes the inventive system particularly valuable as compared to prior art systems.

Turning to the question of blockage by hair or the like, the masking of a particular point on a microphone assembly does not greatly affect the overall signal produced by the ring microphone assembly. This is so because the unobstructed area produces a comparable signal which is still effectively the integrated average of the remaining unblocked radius. While the amplitude of the signal may change somewhat, the phase angle of the signal is still essentially correct and the transfer function modeling employed in modern controllers is able to compensate as part of the real time modelling of the microphone feedback path.

As noted above, in connection with Gaussian noise elimination, from the cancellation signal this aspect is particularly important in the case where the inventive system is implemented into an automobile seat where windows may be periodically opened, or where the automobile may be a convertible which is driven with the top down. Generally, wind effects, which are the strongest Gaussian noise problems (as compared to the repetitive noise problems associated with an automobile engine) are relatively effectively dealt with by the multi-ported microphone assemblies of the instant invention, by excluding them from the audio input.

If we consider the case of an individual 60, as illustrated in FIG. 2, it is noted that the back 62 of the headrest comprises a comfortable soft resilient surface in the manner of a conventional chair while at the same time providing a cancellation surface adjacent the ears 64 and 66 of the individual 60.

Figure 7:
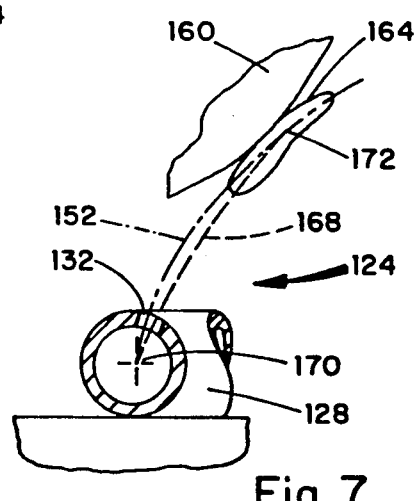
FIG. 7 is an alternative embodiment of a microphone assembly for use in the system of FIG. 1.

Another preferred embodiment is illustrated in FIG. 7. Generally, similar parts or parts performing analogous, corresponding or identical functions are numbered herein with numbers which differ from those of the earlier embodiment by multiples of one hundred.

A variant approach to the manufacturer of a microphone assembly is illustrated in FIG. 7. Here a microphone assembly 124 is provided with an audio input hole 132 which is located along an imaginary line 168 which extends between the center 170 of tubing 128 and the center 172 of the ear 164 of an individual 160. It is noted that in accordance with an idealized design, the cancellation surface 152 would coincide with hole 132 and center 172. Generally, the object of this variant approach is to maximize signal pick-up given the slightly directional characteristics of audio pick-up hole 132.

In accordance with a further preferred embodiment of the invention, varying the phase of the cancellation signal and/or its components is used to further control the position and shape of the surface of maximum cancellation. Further control of the surface can be achieved through the use of ported outputs supported by flexible wave guides which are configured to be a part of aesthetically specified contour shapes.

Figure 8:
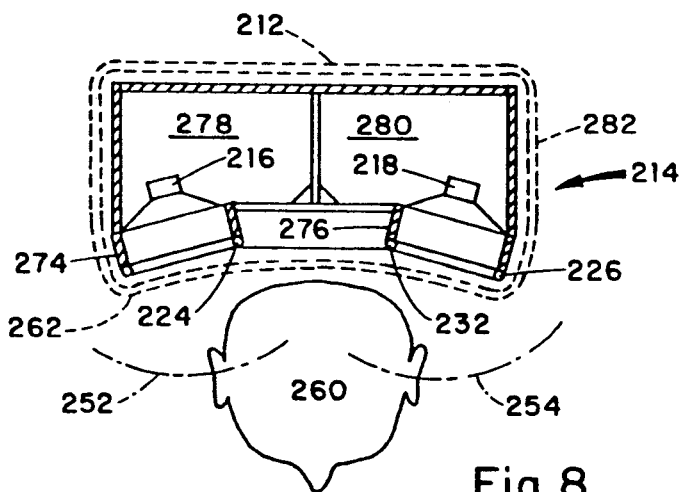
FIG. 8 is an alternative embodiment of the invention, providing a relatively flat profile, in top plan view.

Such an alternative embodiment of the invention is illustrated in FIG. 8. Here the inventive system is incorporated into an automobile headrest 212. Seat back 262 is of a less concave shape in order to improve visibility for the individual 260 seated in the inventive automobile seat 214.

Improved operation is achieved by providing actuators 216 and 218 with tubular cylindrical focussing ports 274 and 276 as illustrated in cross-section in FIG. 8. These focussing ports have the effect of reducing the so-called near-field audio effects of actuators 216 and 218. More particularly, in the regions immediately adjacent the cone of the actuator, the viscosity, mass and elasticity of the air surrounding the actuator has characteristics which give rise to imaginary components as well as real components. For example, the viscosity of the air may be viewed as the analog of electrical resistance while other components may be equated to capacitances and inductances. By removing microphone assemblies 224 and 226 from the near field of the speaker, these near field effects, which generally tend to cause phase problems with respect to sound emitted by the actuators, may be minimized. In addition, the symmetrical nature of microphone assemblies 224 and 226 also tends to remove some of the imaginary components of the system characteristic. In connection with this, it is also noted that the use of an actuator with a commonly symmetric microphone assembly tends to reduce Gaussian or random noise effects, thus resulting in high level of performance in the inventive system.

In accordance with the embodiment illustrated in FIG. 8, unlike the embodiment illustrated in FIGS. 1-6, the signal sent to actuators 216 and 218 is not calculated to result in a cancellation surface which coincides with holes 232 of microphone assemblies 224 and 226. Rather, individual frequency components of the cancellation signal output by the controller are delayed or advanced in phase by an amount which results in their adding up into the undelayed noise cancellation signal at displaced cancellation surfaces 252 and 254. This results in a substantially greater projection of the cancellation surface out from the actuators, allowing the seat designer additional latitude with respect to aesthetic and other features in the design of the seat.

Additional aesthetic concerns may be accommodated by variation of the shape of the back of the seat. However, to some extent, volumes 278 and 280 behind actuators 216 and 218, respectively, must be shaped in accordance with known design techniques used by loudspeaker designers to accommodate acoustical resonant characteristics which result in efficient transmission of audio sounds from actuators 216 and 218 within the desired noise cancellation frequency range.

More particularly, in the case of an automobile seat headrest, it has been found that the predominant range of sound to be cancelled is in the range of 20 to 700 Hertz. Accordingly, speakers having a frequency response in this range may be used as actuators and volumes 278 and 280 are tuned for these frequencies. It is contemplated that the inventive headrest design may be integrated into the upper part of a conventional seat with a slight increase in seat back height and width at the top most portion of the seat back.

In the case of an automobile noise suppression system to be incorporated in the headrest of an automobile seat, a relatively simple method of pushing out the cancellation surface from the actuator may be employed. In particular, the actuator may be modified by seeking out the predominant frequency component of the required cancellation signal and simply delaying the entire output signal by a time equal to the time which it takes the signal to travel from a point on the sphere defined by the input port holes 232 of the microphone assemblies to points on the displaced cancellation surfaces 252 and 254. This approach represents a good first order approximation for the entire signal in simple noise environments and, with respect to the fundamental, represents a substantially accurate solution.

Finally, in the case of the automobile seat illustrated in FIG. 8, it may be desirable to provide the same with an upholstery facade 282.

Figure 9:
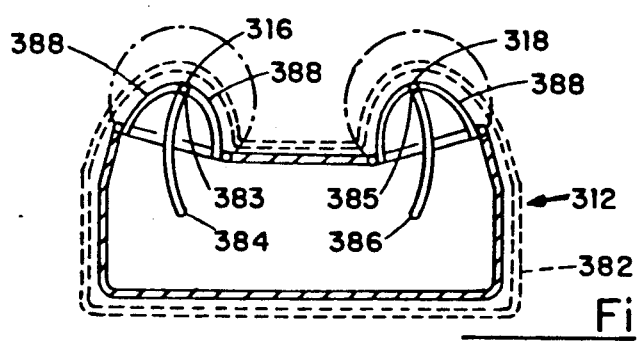
FIG. 9 is yet another alternative headrest system.

Still another possible approach is illustrated in FIG. 9. In particular, as an alternative to delay, the actuator may be brought close to the ear area or a contact microphone positioned in the ear to produce cancellation in the vicinity of the ear. Here the inventive noise cancelling headrest 312 has small piezoelectric actuators 383 and 385 at the ends 316 and 318 of a pair of hollow flexible tubes 384 and 386 in place of the loudspeaker type actuators. These actuators 383 and 385 are driven with a source of cancellation noise. Ends 316 and 318 are supported by a plurality of flexible arms 388 which are generally shaped to fit the form of any desired headrest contour. Thus, when covered with upholstery facade 382, a pleasant appearance is given.

Figure 10:
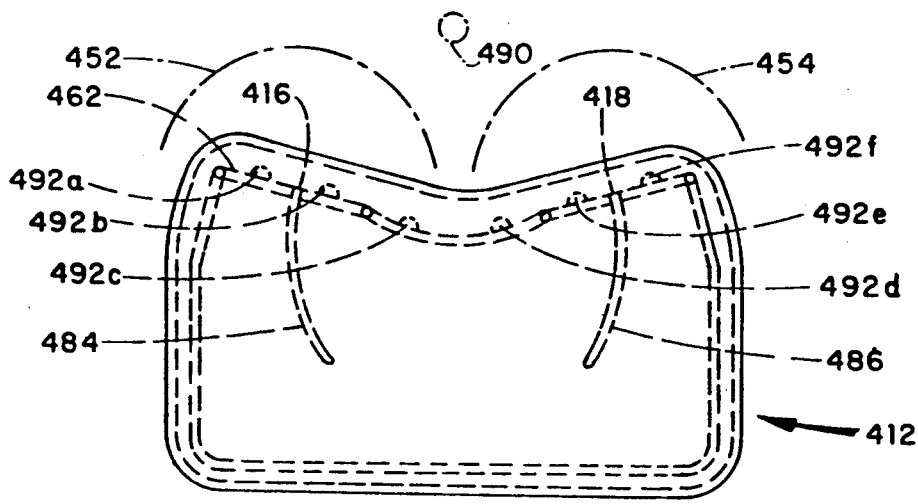
FIG. 10 is an embodiment with a head position sensing system.

Referring to FIG. 10, yet another alternative embodiment of the inventive noise cancelling headrest 412 is illustrated. Generally, in accordance with this embodiment, tubes 484 and 486 are placed with their ends 416 and 418 substantially flush with the back 462 of the headrest 412, and are driven at their opposite ends by an acoustic source of noise cancelling audio.

Using either of the phase delay techniques described above, the cancellation surfaces 452 and 454 are pushed outwardly. Moreover, in accordance with this embodiment, a sonic emitter 490 may also be used to emit an audio tone which is detected by sonic detectors 492a-f which are positioned on opposite sides of the sonic emitter 490.

By detecting the amplitude of the audio signal produced by emitter 490 at the various points where detectors 492a-f are positioned, a relatively simple analysis such as locating the detector receiving the minimum amplitude will reveal the position of the head of an individual using the inventive headrest 412. For example, for a sound source such as emitter 490 directly in front of the head, if the signal detected by detectors 492d, 492e and 492f is relatively low while the signal detected by the other detectors is relatively high, the head of the individual is adjacent detectors 492d, 492e and 492f. Accordingly, it is then necessary to reduce the radius of spherical cancellation surface 454 and increase the radius of spherical cancellation surface 452 to accommodate this different head position. In this manner, head movement may be compensated for while maintaining effective noise cancellation.

Figure 11:
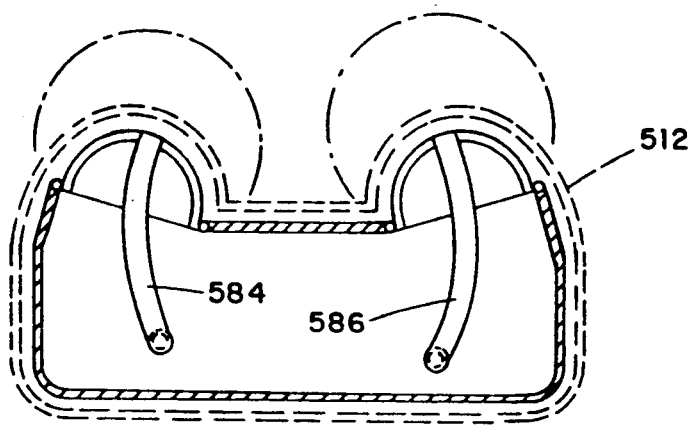
FIG. 11 an alternative embodiment of the invention.

Still another possibility is the use of a pair of ultrasonic ranging devices at opposite sides of the user's head. A simultaneous solution of both ranges will thus show the right and left limits of head position. Referring to FIG. 11, it may be desirable to achieve cancellation of particular noises having strong components in, for example, the low frequency audio range. The same may be more effectively achieved by tailoring the characteristics of tubes 584 and 586 to match the audio characteristics which one is attempting to cancel using the inventive headrest 512. In the particular case of the system shown in FIG. 11, lower frequencies could better be compensated using larger diameter tubes 584 and 586, which may range from five to thirteen centimeters in diameter, as illustrated. Nevertheless, ported speaker actuator designs such as those described below will be more effective.

In a manner similar to the tube end actuators used in FIGS. 9-11, it may also be desirable to use acoustic wave guides to carry sound from the microphone tube assembly. In particular, as illustrated in FIGS. 12 and 13, a microphone assembly 624 may be provided with a tube receiving hole 540, which would receive a pneumatic line 594 which would carry audio input through holes in tubular member 628 to a remote microphone at the other end of acoustic tubular waveguide 594.

Figure 14:
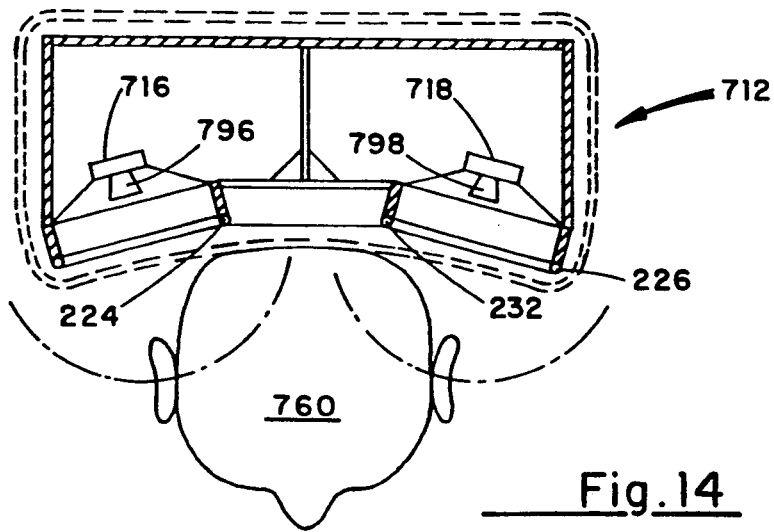
FIG. 14 is a top plan view of another alternative.

The possibility also exists to introduce a desired signal into the environment without affecting noise cancellation. The process of implementing a stereo seat is done by mixing the lower frequencies in the range of 20 to 4000 Hz of the added audio signal with the controller. A second higher frequency speaker is added to handle the higher frequencies. A cross-over network is needed to separate the two bands of the audio signal. In the case of a repetitive controller, the controller ignores the audio signal and treats it as random noise. For a random controller, the noise is added as additional input to the random controller and subtracted (with the proper compensation) from the controller output driving the actuators. Thus, if desired, the system can incorporate, as actuators, conventional coaxial high fidelity speakers, 716 and 718, which include high fidelity coaxial tweeters 796 and 798, respectively, as illustrated in FIG. 14. Such a noise cancelling headrest 712 has its actuator modified to the extent that the actuator would recognizes the desired entertainment music or audio program being fed to actuators 716 and 718 whereby this program is not cancelled, thus leaving only the program to be heard by the individual 760 using the headrest 712. Such a system would also have the added advantage of masking the residual noise remaining after cancellation.

The application of a ported enclosure design similar to those used in loudspeaker designs[1] to the field of dynamic noise cancellation enhances performance in applications where the cancellation noise generating components must be located a distance away from the area where noise cancellation is required. One such application is a noise cancelling system designed for use in nuclear magnetic resonance applications. In this application, the sound of the machine causes the patient discomfort and needs to be cancelled. Because of the nature of the machine, magnetic material cannot be positioned in the nuclear magnetic resonance measurement zone. For this application, a ported enclosure design made of plastic is ideal in that the speaker and microphone elements can be located a distance away. All of the materials in the measurement zone are plastic and hence transparent to the nuclear magnetic resonance process. FIG. 15 shows a diagrammatic representation of an extended ported enclosure for an nuclear magnetic resonance system 810 including a patient bed 811. ,6 [1] See for example, "The Third Dimension: Symmetrically Loaded" by Jean Margerand, *Speaker Builder*, June, 1988 and references cited therein.

In this design, the magnetic speaker 816 and metal microphone 836 are located several feet from the nuclear magnetic resonance measurement zone adjacent the head 860 of the patient. The ported speaker design is chosen using a 1 to 2 meter long, fifteen centimeter diameter plastic port 874. A ring microphone assembly 824 at the end of port 874 is used to project the sphere of cancellation from assembly 824 about five centimeters to the ear of the reclining patient. A vented sensing tube 894 connected to the ring microphone assembly 824 allows the microphone to be located a distance away. When using a sensing tube, typically, frequency compensation is employed to correct for the nonlinear frequency response of the tube.

A typical configuration for a ported system of this type using a commercially available driver would employ a 16.5 centimeter Polydax HD17B25 speaker as an actuator. For this design the front volume 815 is 4.72 liters, the rear volume 817 is 10.28 liters and the length of the 182 cm² cross-sectional area hemholtz port 874 is 127 cm. The frequency range for this design is about 40 to 200 Hz. It should be noted that the use of different speakers and volume configurations can provide a wider frequency response. Alternatively, the use of a multi-chambered design, as will be described below, can also produce wider frequency range cancellation.

FIG. 16 and FIG. 17, which is a cross-sectional view along line 17—17 of FIG. 16, show another alternative noise cancelling seat 910 incorporating a headrest 912. This approach integrates a symmetrically loaded ported speaker design into the available seat dimensions to allow dynamic cancellation to be added to an existing seat contour without any increase in the seat dimensions. A ring microphone assembly 924 is again used at the end of the port and provides the same benefits.

This design is different from rear box enclosures such as that of the FIG. 1 design, in that the rear volume 917, front volume 915 and hemholtz tube port 974 all determine the frequency characteristics.

Actuator 916 is placed inside a rear volume 917 which is defined by wall 919. Rear volume 917 has a depth 919 of five centimeters and a height 921 of 31 centimeters. Actuators 916 and 918 have a diameter of about eighteen centimeters. Helmholz port 974 is a circular pipe with a length of about seven centimeters and a diameter of ten centimeters. The thickness 923 of seat 910 is about nine centimeters, with an inside dimension of about eight centimeters.

The frequency limits for a single 16.5 inch actuator is 95 to 265 Hz. To provide the full cancellation range possible in dynamic noise cancellation, a multiple concentric port arrangement such as that of FIG. 18 is required.

Here the second concentric port section 1011 comprising a higher frequency actuator 1001 in a separate rear volume 1002 defined by barrier 1003 drives a separate helmholtz port tube 1004. Tube 1004 is concentric with port 1074 and drives tube 1004 via a second front volume 1004 defined by barrier 1005. Port section 1011 is tuned to cover the range from above 265 Hz to around 800 Hz. The controller provides crossover logic that splits the cancellation output for each channel into two components that drive each of the ported speaker sections.

While an illustrative embodiment of the invention has been described above, it is, of course, understood that various modifications will be apparent to those of ordinary skill in the art. Such modifications are within the spirit and scope of the invention, which is limited and defined only by the appended claims.

We claim:

1. A personal noise cancellation system to reduce undesired noise for an individual which system comprises:
   (a) an acoustic structure intended to provide a localized zone of noise cancellation for a single individual with the acoustic structure in the vicinity of the individual;
   (b) an acoustic actuator having an output to emit an audio cancellation signal in a direction towards the individual to reduce said undesired noise in response to a received electrical cancellation signal which acoustic actuator is supported by said acoustic structure;
   (c) audio input means to sense undesired noise receivable by said individual and produce an output for cancellation; and
   (d) a noise cancellation controller to receive the output of the audio input means and generate said electrical cancellation signal for the acoustic actuator;

wherein said audio input means comprises:
   (i) an elongated audio input mixing chamber extending transversely of the direction of output of the acoustic actuator to average a plurality of audio input signals received therein;
   (ii) an array of audio input points to said elongated audio input chamber which audio input points are distributed in said transverse direction of output of the acoustic actuator and are designed to receive audio input signals from said direction;
   (ii) at least one microphone acoustically coupled to said elongated chamber to receive a mixed and averaged audio input therefrom; and wherein said audio input chamber is substantially enclosed to shield its volume from said cancellation signal, is disposed around the acoustic actuator output and is cooperative therewith to define a cancellation region at a location removed from said audio input means in the direction towards the individual.

2. A noise cancellation system as in claim 1, wherein said acoustic actuator has a theoretical equivalent point source position and said acoustic actuator is positioned with said point source position inside a cylinder defined by said array of audio inputs symmetrical assembly.

3. A noise cancellation system as in claim 2, wherein said audio input points are arranged in a symmetrical assembly, said symmetrical assembly is symmetrical about an axis substantially perpendicular to a plane defined by said symmetrical assembly and said point source position is substantially located on said axis and a zone of maximum cancellation is defined by a portion of a spherical surface substantially centered on said point source position and substantially including said symmetrical assembly of audio inputs.

4. A noise cancellation system according to claim 1 wherein the audio input points are arranged in a closed loop located around the end of a focusing port for the output of the acoustic actuator.

5. A noise cancellation system according to claim 1 wherein said audio input chamber comprises a tubular member having a plurality of holes defined therein and oriented at positions to achieve maximum signal to noise ratio for the cancellation surface being generated.

6. A noise cancellation system according to claim 5 wherein said tubular member comprises a substantially circular flexible plastic tube, said holes being in a surface of the tube facing in the direction towards the individual.

7. A noise cancellation system according to claim 6 wherein said plastic tube has an inside diameter of about 2.5 cm. and a wall thickness of about 0.2 cm.

8. A noise cancellation system according to claim 5 comprising a plurality of microphones positioned to receive audio input from within said tubular member and arranged symmetrically along its length.

9. A noise cancellation system according to claim 8 wherein each microphone is in a further hole in the tubular member and has a front surface lying approximately flush with an inside surface of the tubular member.

10. A noise cancellation system according to claim 1 wherein said audio input means comprises a plurality of microphones and the noise cancellation controller has controller electronics including mixing means for the output of said microphones.

11. A noise cancellation system according to claim 10 wherein the noise cancellation electronics comprises an electronic dynamic noise controller which has its output coupled to an amplifier which amplifier has its output coupled to the acoustic actuator the input of said dynamic noise controller being coupled to the mixed output of said microphones.

12. A noise cancellation system according to claim 1 wherein the noise cancellation controller includes means to vary the phase of the cancellation signal or its components further to control the position and shape of a surface of maximum cancellation.

13. A noise cancellation system according to claim 1 comprising the use of a ported output for said acoustic actuator which ported output is supported by a flexible wave guide configured to be a part of an aesthetically specified contour shape and further control a surface of maximum cancellation in the cancellation region.

14. A noise cancellation system according to claim 1 wherein the acoustic actuator is provided with a tubular focussing port.

15. A noise cancellation system according to claim 1 wherein the noise cancellation controller includes processing means to select a predominant frequency component of the required cancellation signal and to delay the output signal by a time equal to the time which it takes the signal to travel from an audio input point to the cancellation region.

16. A noise cancellation system according to claim 1 wherein the acoustic actuator comprises a loudspeaker.

17. A noise cancellation system according to claim 1 wherein the acoustic actuator comprises a tube connected to a piezo-electric device.

18. A noise cancellation system according to claim 1 wherein the output of the acoustic actuator is closer to the individual than is the array of audio input points.

19. A noise cancellation system according to claim 1 wherein the microphone is located remotely from the audio input means and the audio input means comprises an extended tubular waveguide by means of which the microphone is acoustically coupled to the audio input means.

20. A noise cancellation system according to claim 1 wherein the acoustic actuator comprises at its output a plurality of concentric waveguide tubes separately communicable with acoustic cancellation signals having different frequency characteristics.

21. A noise cancellation system according to claim 1 for a single ear of the individual said acoustic structure being in the vicinity of said single ear and said acoustic actuator being capable of outputting said cancellation signal towards said single ear wherein the plurality of audio input devices is supported on said acoustic structure in a closed loop around said acoustic actuator.

22. A noise cancellation system according to claim 21 which includes separate such acoustic structure, acoustic actuator and audio input means for each ear of the individual.

23. A noise cancellation system according to claim 22 including means to detect movement of the individual's head and adjust the noise cancellation output to compensate for such movements by changing the position of each cancellation region.

24. A personal noise cancellation system to reduce undesired noise for an individual in the vicinity of nuclear magnetic resonance apparatus which system comprises:
(a) an acoustic structure intended to provide a localized zone of noise cancellation for a single individual with the acoustic structure in the vicinity of the individual;
(b) a magnetic loudspeaker actuator having an output to emit an audio cancellation signal in a direction towards the individual to reduce said undesired noise in response to a received electrical cancellation signal which loudspeaker actuator is supported by said acoustic structure;
(c) audio input means to sense undesired noise receivable by said individual and produce an output for cancellation; and
(d) a noise cancellation controller to receive the output of the audio input means and generate said electrical cancellation signal for the loudspeaker actuator;
wherein said audio input means comprises:
(i) an elongated audio input mixing chamber extending transversely of the direction of output of the loudspeaker actuator to average a plurality of audio input signals received therein;
(ii) an array of audio input points to said elongated audio input chamber which audio input points are distributed in said transverse direction of output of the loudspeaker actuator and are designed to receive audio input signals from said direction;
(ii) at least one microphone acoustically coupled to said elongated chamber to receive a mixed and averaged audio input therefrom; and
wherein said audio input chamber is substantially enclosed to shield its volume from said cancellation signal, is disposed around the loudspeaker actuator output and is cooperative therewith to define a cancellation region at a location removed from said audio input means in the direction towards the individual wherein the microphone is located remotely from the audio input means and the audio input means comprises an extended tubular waveguide by means of which the microphone is acoustically coupled to the audio input means whereby the loudspeaker actuator can be removed to a remote position free of interference with the nuclear magnetic resonance apparatus.

25. A seat equipped with a personal noise cancellation system to reduce undesired noise for an individual which system comprises:
(a) a pair of acoustic structures one for each ear of the individual which acoustic structures are intended to provide a localized zone of noise cancellation with the acoustic structure in the vicinity of the individual;
(b) a pair of acoustic actuators one for each ear of the individual said acoustic actuators each having an output to emit an audio cancellation signal in a direction towards the individual to reduce said undesired noise in response to a received electrical cancellation signal which acoustic actuator is supported by said acoustic structure;
(c) audio input means associated with each acoustic actuator to sense undesired noise receivable by said individual and produce an output for cancellation; and (d) a noise cancellation controller to receive the output of the audio input means and generate said electrical cancellation signal for each acoustic actuator;

wherein said audio input means comprises:
(i) an annular audio input mixing chamber extending transversely of the direction of output of the acoustic actuator to average a plurality of audio input signals received therein;
(ii) an array of audio input points arranged symmetrically around said annular audio input chamber which audio input points are distributed in said transverse direction of output of the acoustic actuator and are designed to receive audio input signals from said direction;
(ii) at least one microphone acoustically coupled to said elongated chamber to receive a mixed and averaged audio input therefrom; and wherein said audio input chamber is substantially enclosed to shield its volume from said cancellation signal, is disposed around its associated acoustic actuator output and is cooperative therewith to define a cancellation region at a location removed from said audio input means in the direction towards the individual.

26. A seat according to claim 25 for an individual using said seat having a head rest in which said acoustic structures are incorporated one on each side of the seat.

27. A seat according to claim 26 wherein each acoustic actuator is a loudspeaker and the seat includes an acoustic resonant volume behind each acoustic actuator.

28. A seat according to claim 27 wherein said loudspeaker has a frequency response in the range of from 20 to 700 hertz and each resonant volume is tuned to said frequency range.

29. A seat according to claim 26 wherein the noise cancellation system is incorporated in the seat substantially without projections from the normal form of a seat.

30. A seat according to claim 29 wherein each acoustic actuator comprises at its output a plurality of concentric waveguide tubes separately communicable with acoustic cancellation signals having different frequency characteristics.

31. A seat according to claim 30 comprising a loudspeaker for each waveguide tube and a resonance chamber behind each loudspeaker said loudspeaker having different frequency characteristics which loudspeakers and resonance chambers are also incorporated in the seat.

32. A seat according to claim 25 comprising including detection means to detect movement of the individual's head and adjust the noise cancellation output to compensate for such movements by changing the position of each cancellation region.

33. A seat according to claim 32 wherein said detection means comprises a sonic generator and a plurality of sonic detectors positioned to have different paths to said generator which paths are interruptable by different head positions.

34. A noise cancellation system to reduce undesired noise in a cancellation volume subject to repetitive and random noise comprising:
(a) an acoustic actuator for outputting a directed audio cancellation signal to the cancellation volume to reduce said undesired noise in response to a received electrical cancellation signal;
(c) audio input means to sense said undesired noise and produce an output for cancellation; and (d) a noise cancellation controller to receive the output of the audio input means and generate said electrical cancellation signal for the acoustic actuator;

wherein said audio input means comprises:
(i) an elongated audio input mixing chamber extending transversely of the direction of output of the acoustic actuator to average a plurality of audio input signals received therein said elongated chamber being capable of integrating and smoothing said inputs;
(ii) an array of audio input points to said elongated audio input chamber which audio input points are distributed in said transverse direction of output of the acoustic actuator to receive audio input signals; and
(iii) at least one microphone acoustically coupled to said elongated chamber to receive a mixed and averaged audio input therefrom;

said audio input chamber being substantially enclosed to separate its volume from surrounding volumes whereby the presence of random noise derived components in said cancellation signal can be reduced.

35. A noise cancellation system according to claim 34 wherein said audio input chamber is disposed around the acoustic actuator output and its audio input volume is separated from said acoustic actuator output to avoid interference therefrom.

36. A personal noise cancellation system to reduce undesired noise for an individual which system comprises:
(a) an acoustic structure intended to provide a localized zone of noise cancellation for a single individual with the acoustic structure in the vicinity of the individual;
(b) an acoustic actuator for outputting an audio cancellation signal towards the individual to reduce said undesired noise in response to a received electrical cancellation signal which acoustic actuator is supported by said acoustic structure;
(c) audio input means to sense undesired noise receivable by said individual and produce an output for cancellation; and
(d) a noise cancellation controller to receive the output of the audio input means and generate said electrical cancellation signal for the acoustic actuator;

wherein said audio input means comprises a plurality of noise-sensing devices at a plurality of points disposed around the acoustic actuator output and cooperative therewith to define a cancellation region at a location removed from said audio input means in a direction towards the individual.

37. A personal noise cancellation system according to claim 36 for a single ear of the individual said acoustic structure being in the vicinity of said single ear and said acoustic actuator being capable of outputting said cancellation signal towards said single ear wherein the plurality of audio input devices is supported on said acoustic structure in a closed loop around said acoustic actuator.

38. A personal noise cancellation system according to claim 36 wherein each of said noise-sensing devices comprises an opening in a tube defining an audio input mixing chamber and at least one microphone acoustically coupled to said chamber.

39. A personal noise cancellation system according to claim 36 wherein said audio input means comprises a plurality of microphones acoustically coupled with the audio input chamber.

* * * * *